United States Patent [19]

Groves et al.

[11] Patent Number: 5,756,234
[45] Date of Patent: May 26, 1998

[54] HIGH ACCURACY FABRICATION OF X-RAY MASKS WITH OPTICAL AND E-BEAM LITHOGRAPHY

[75] Inventors: Timothy R. Groves, Poughkeepsie; Juan R. Maldonado, Chappaqua, both of N.Y.

[73] Assignee: International Business Machines Corporation, Armonk, N.Y.

[21] Appl. No.: 663,826

[22] Filed: Jun. 14, 1996

[51] Int. Cl.⁶ .................................................. G03F 9/00
[52] U.S. Cl. .............................. 430/5; 378/34; 378/35
[58] Field of Search ........................... 430/5, 311, 312, 430/313, 22; 378/34, 35

[56] References Cited

U.S. PATENT DOCUMENTS

| | | |
|---|---|---|
| 4,610,948 | 9/1986 | Glendinning .................. 430/296 |
| 5,227,269 | 7/1993 | Scott ............................... 430/5 |
| 5,306,584 | 4/1994 | Palmer ........................... 430/5 |
| 5,656,399 | 8/1997 | Abate et al. .................... 430/5 |

FOREIGN PATENT DOCUMENTS

| | | |
|---|---|---|
| 250 400 A1 | 3/1982 | German Dem. Rep. . |
| 0250400 | 10/1987 | Germany . |

*Primary Examiner*—S. Rosasco
*Attorney, Agent, or Firm*—Whitham, Curtis & Whitham; William B. Porter

[57] ABSTRACT

X-ray lithography is used in the fabrication of very large scale integrated circuits. Optical lithography techniques are used to create a preliminary mask with coarse features in the preparation of a high resolution x-ray mask. The E-beam tool may register the location of the E-beam relative to the optically written coarse features. This helps the tool to navigate according to the location of specific features.

10 Claims, 3 Drawing Sheets

HIGH ACCURACY FABRICATION OF X-RAY MASKS WITH OPTICAL AND E-BEAM LITHOGRAPHY

BACKGROUND OF THE INVENTION

1. Field of the Invention

The present invention generally relates to fabrication of very large scale integrated (VLSI) circuits and, more particularly, to the fabrication of X-ray lithography masks with optical and electron beam (E-beam) lithography.

2. Background Description

Fabrication of high placement accuracy (<20 nm), large field (>30 mm) one power magnification (1X) X-ray masks is required to extend X-ray lithography to 0.12 μm ground rules. Although considerable work is being done to improve available E-beam writer technology, currently there is no E-beam tool capable of meeting the overlay requirements of 1X X-ray masks for 0.12 μm ground rules.

Presently, there is no solution for this problem. However, work is underway to improve the performance of E-beam writers for 1X X-ray masks. X-ray masks are presently fabricated utilizing product specific emulation (PSE). This iterative process involves only E-beam writing without the optical lithography steps. However, more development work will be required to meet the 0.12 μm device ground rules.

Fabrication of X-ray masks involving a reference grating created optically on the X-ray mask substrate previous to E-beam writing have been proposed. Also, the use of an array of metallic dots previously defined on an optical reticle to be E-beam selectively addressed to define the lithographic pattern after etching has been proposed. The purpose of the grating and the array of dots is to increase the positional accuracy of the E-beam tool.

X-ray masks have been fabricated using two E-beam writing steps, but this technique offers only resolution advantages. There are no placement accuracy advantages using this technique.

SUMMARY OF THE INVENTION

It is therefore an object of the present invention to provide a technique to obtain X-ray lithography masks meeting the placement accuracy and resolution requirements of high density microelectronic devices.

The technique according to the invention makes available high quality 1X X-ray mask before the E-beam technique is fully refined. The inventive method follows the steps of exposing the mask optically with coarse features, making patterns, and then doing E-beam processing and aligning the E-beam pattern to the features already there. A focused E-beam scan is turned on and off to create a pattern.

The invention allows the E-beam tool to register the location of the E-beam relative to the previously written surface. This helps the tool to navigate according to the location of specific features. The E-beam tool has a focused electron beam with two modes of operation. In the first mode, the tool performs lithography. In the second mode, the tool can scan over the writing surface and locate a reference point placed on the surface. This second mode of operation provides the tool the ability to signal its location with regard to the writing surface. Prior to lithography, features are placed on the writing surface at known locations to serve as reference points. Automated software is used to switch the tool between the two modes of function. In operation, the tool can be switched from its lithography mode to scan ahead and find a next reference point on the substrate surface.

This invention requires modifications to the E-beam writing software. The E-beam tool is committed to provide acceptable placement accuracy with a one pass write.

This invention is novel in its use of current generation optical projection lithography N power magnification (NX) exposure tool to create an X-ray mask suitable for use in a next generation proximity (1X) X-ray lithography exposure tool. This technique relaxes the placement accuracy requirements of E-beam mask writers on 1X large field, and takes advantage of the high placement accuracy possible with NX optical reduction. In addition, the technique makes use of the inherent high resolution of E-beam lithography, supplementing the resolution of the optical lithography printers. The E-beam mask writer used in the practice of the invention is required to have high placement accuracy only on a relatively small field, adjacent to the optically positioned "coarse" features. The above advantages are accomplished without the need of a previously defined grating or dot array on the X-ray mask substrate; the coarse X-ray absorber pattern delineated with the optical tool serves as the reference to provide the high placement accuracy. In addition, the data handling requirements are also decreased relative to the case of writing the complete X-ray mask with an E-beam tool.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

This disclosure describes techniques to obtain 1X X-ray lithography masks meeting the placement accuracy and resolution requirements of sub 0.25 μm devices. The proposed method involves fabricating an X-ray daughter mask on a 1X X-ray mask substrate utilizing two lithographic steps; optical and E-beam.

Figure 1:
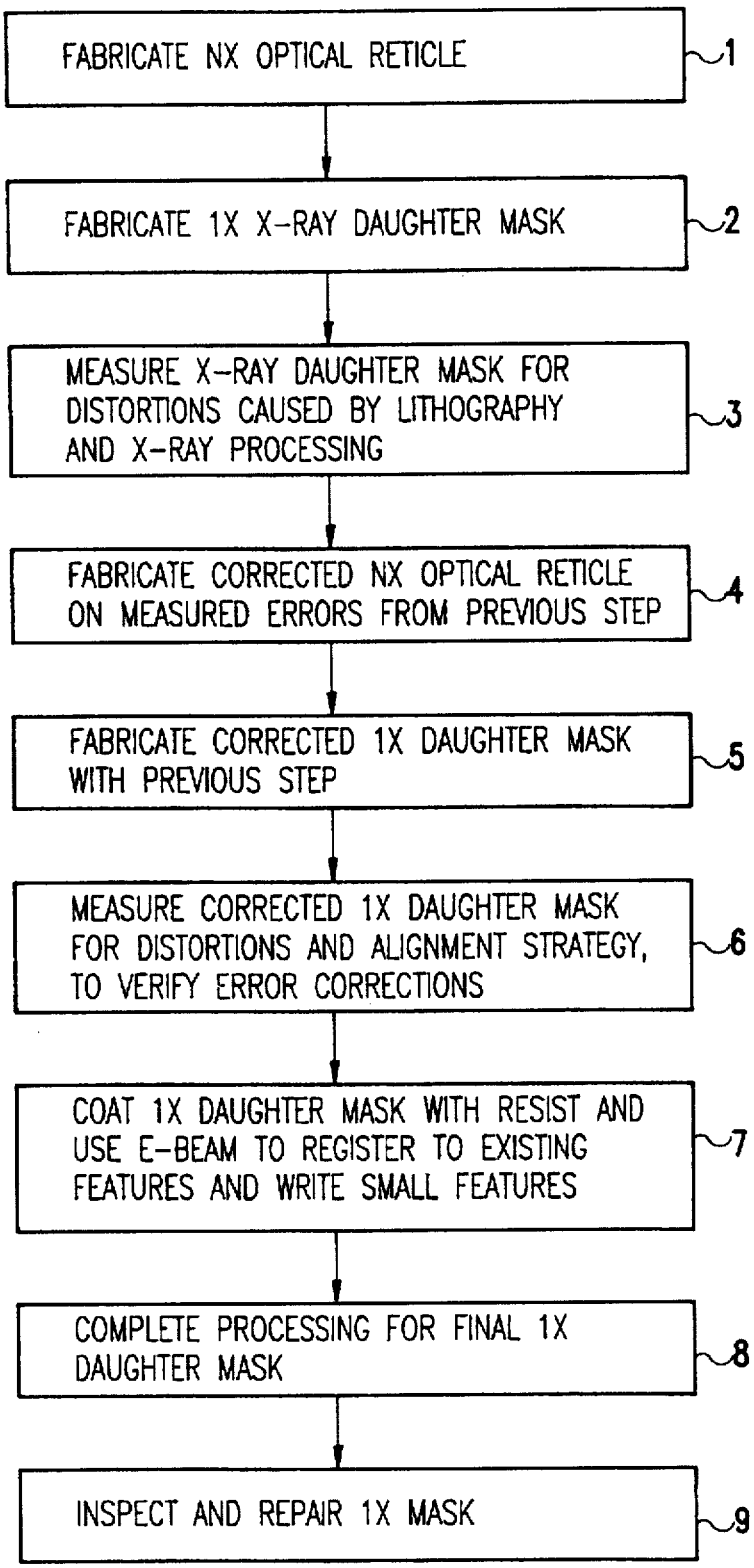
FIG. 1 is a flow chart of the inventive method.

Referring now to the drawings, and more particularly to FIG. 1, there is shown a flow chart showing the steps of the present invention. The steps shown in FIG. 1 increase placement accuracy and remove distortions from the optical printing tool and mask fabrication process. Starting with the first step shown in block 1, an NX optical reticle is fabricated with an appropriate mask writer. This optical reticle contains the coarse features. After the optical reticle is fabricated, a coarse preliminary X-ray daughter mask is fabricated, as is shown in block 2.

The optical reticle and the preliminary X-ray daughter mask contain device patterns with dimensions as small as the previously determined useful resolution of the optical tool (without compromising the device ground rules on overlay and line width control). If all pattern features are under the resolution limit of the optical tool then the optical printed pattern could be used for determining the position of the desired features using symmetry considerations (e.g. for a rectangle shaped feature which is printed as an ellipse, the center of the ellipse can be used to determine the position of the edges of the rectangle). The preliminary daughter mask will take advantage of the excellent placement accuracy possible with the NX reduction technique. In particular, corrections for lens distortion may be provided in the optical reticle to increase the placement accuracy.

Next, as shown in block 3, the mask is measured for distortions caused by lithography and X-ray processing. Then, as shown in block 4, a new optical reticle is fabricated. This reticle may contain a portion of a device pattern (coarse features)and/or fiducial marks to provide alignment to the e-beam writer.

The process now either proceeds through the steps shown in blocks 5, 7, 9, and 11 or the steps shown in blocks 6, 8, 10, and 12. The alternative discussed first will be that starting with the step shown in block 5. After fabricating the new optical reticle, a new X-ray daughter mask is fabricated using the new optical reticle, as shown in block 5.

Figure 2B:
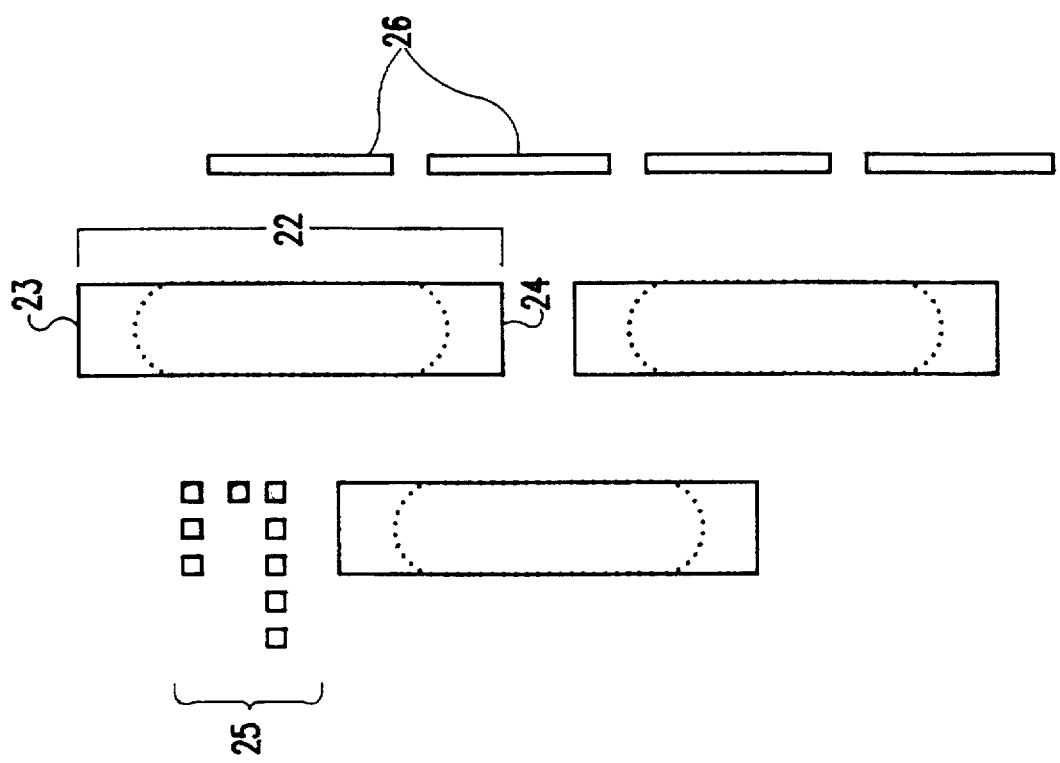
FIGS. 2A and 2B show patterning which can result with an optical tool alone and with an optical tool followed by the E-beam tool.
Figure 2A:
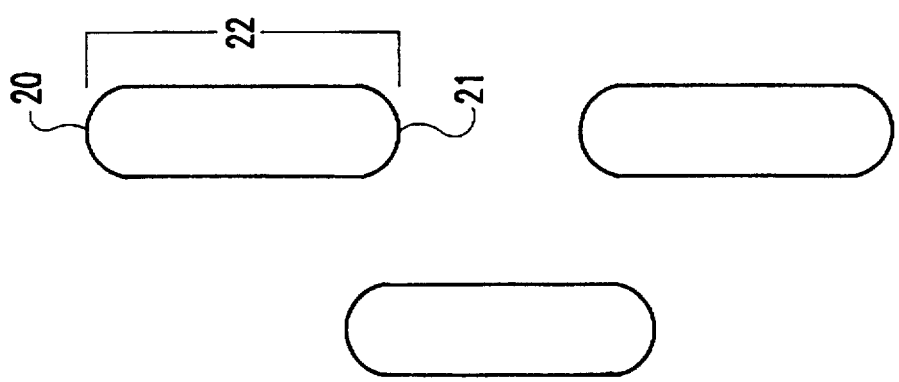

FIG. 2A shows the pattern of the mask following etching by an optical tool. This is how a pattern might appear after the fifth step shown in block 5 of FIG. 1. As can be seen, the ends 20, 21 of the large features 22 are rounded. The optical tool does not have the resolution to create critical features or square the ends 20, 21 of the large features 22 and suffers from image shortening effects.

Returning to the flow diagram of FIG. 1, the sixth step shown in block 7, is to measure the corrected daughter mask for distortions and alignment strategy. This step will verify error corrections which have been made in previous steps. The daughter mask, as shown in block 9, is then coated with resist and critical features are written. The substrate is scanned to register the location of existing features. This scanning is accomplished using the same electron beam which is used to write the critical pattern features. The scanning is performed at a dose which is too low to expose the resist. In this way the final written image is not disturbed by the scanning. By scanning the previously printed pattern features, one obtains a precise measurement of the position of the writing beam relative to the existing pattern (as distinct from reference marks or grid). The final processed mask thus has the e-beam written critical features precisely positioned relative to the optically written features forming one accurate composite pattern. Then, as shown in block 11, the daughter mask is now completed. Finally, the daughter mask is inspected and repaired as shown in block 13.

Now, the alternative steps of 6, 8, 10, and 12 are discussed. After the step of fabricating a new optical reticle shown in block 4, a corrected daughter mask is only partially fabricated. In doing so, a small portion of absorber thickness is either deposited or etched to a thickness which is readable for alignment purposes by the e-beam. The amount of absorber thickness which is deposited or removed to provide a relieved pattern is most likely less than 100 nm. The next step, which is shown in block 8, is to measure the corrected 1X daughter mask for distortions and alignment strategy and to verify the error corrections have been made. The step shown in block 8 is the same as the step shown in block 7.

After measuring the partially fabricated daughter mask, the complete pattern is e-beam written, aligning to the relieved features, as shown in the step of block 10. In this step the coarse and critical features are fully patterned. The step shown in block 10 differs from the step shown in 9 block because the procedure which uses block 9 fully patterned the coarse features earlier in the process. Then, as shown in the step shown in block 12, the processing of all features for the 1X daughter mask is complete. In contrast, the step shown in block 11, of the first alternative discussed only requires processing of the critical features, as processing of coarse features is completed before the step shown in block 11. Finally, the daughter mask is inspected and repaired as shown in block 13.

The pattern obtained after completion of processing is illustrated in FIG. 2B. FIG. 2B shows the results of patterning following both optical and E-beam tool patterning. The large features 22 have squared ends 23, 24 and have been corrected for image shortening effects. Critical features 25 and 26 have been added.

After the preliminary daughter mask is fabricated, the remaining fine features required to meet the device ground rules may be written with a high resolution E-beam tool. The E-beam tool will register the fine patterns to the features of the preliminary mask using conventional alignment techniques. To avoid exposing the resist during alignment, fiducial marks can be provided in the chip's kerf. Alternatively, a more accurate alignment may be accomplished by scanning the E-beam at several places across a particular coarse feature of the mask absorber, depositing a dose on each pass lower than the threshold exposure of the resist. A standard electron detector may be utilized to pick up the scattered and secondary electron from the absorber features of the X-ray mask. Simple calculations indicate that it is possible to obtain adequate signal to noise ratio (SNR) per E-beam pass using common resist materials. This technique can determine the position of the feature and allow registration of the "fine" pattern relative to the "coarse". The E-beam written pattern on resist may then be processed to obtain a complete 1X X-ray mask ready for inspection and repair at the sub 0.25 µm level. Inspection and repair of the preliminary mask may be accomplished before the E-beam writing step.

Figure 3:
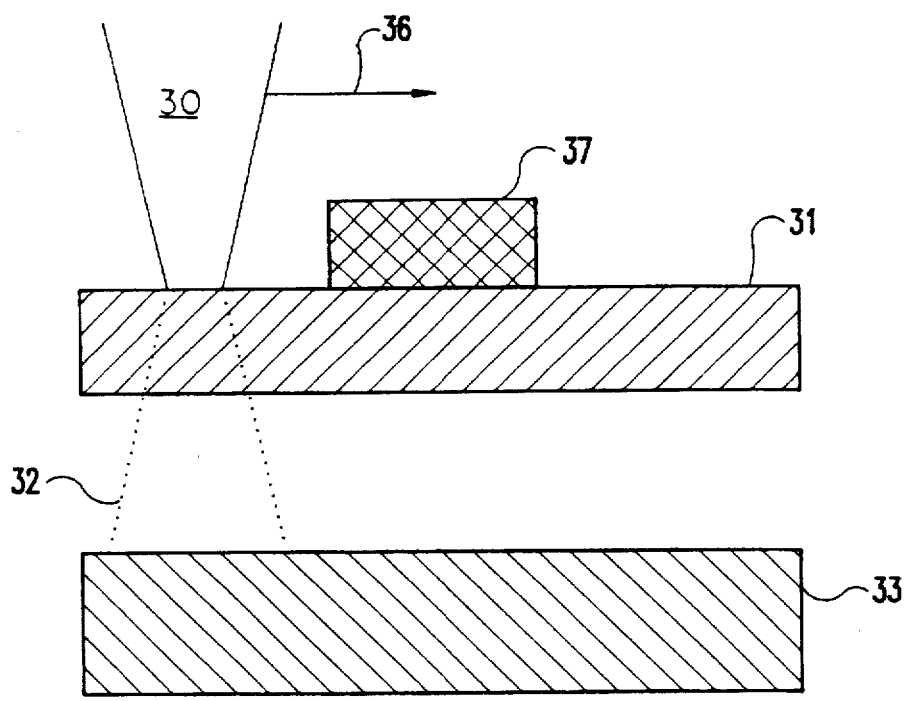
FIG. 3 shows a cross-section being scanned.
Figure 4:
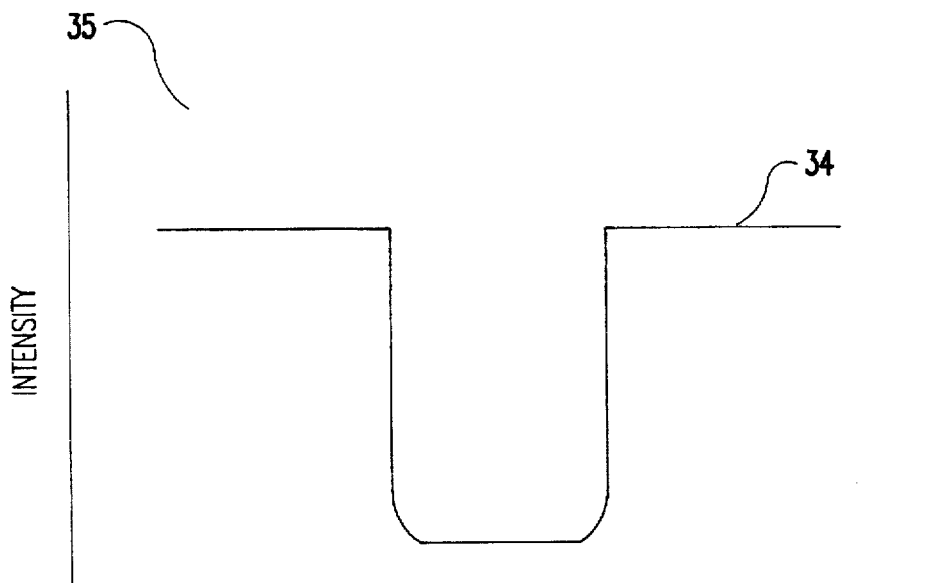
FIG. 4 is a graph illustrating the signal resulting from the scan of FIG. 3 as it would be interpreted by the detector.

This scanning and registration ability can be understood with reference to FIG. 3. FIG. 3 shows an incident electron beam 30 scanning a patterned X-ray mask 31. The electron beam is transmitted at 32 through the X-ray mask 31 and registers with a detector 33. The arrow 36 indicates the direction which the electron beam is scanning. A signal from detector 33 is registered as the incident electron beam passes across the X-ray mask. The signal of the detector is shown in the graph of FIG. 4. When the incident electron beam 30 passes over a pattern feature 37, no transmitted electron beam 32 is registered with the detector 33. Therefore, the signal drops in intensity while the incident electron beam registers this feature, as illustrated in FIG. 4.

It is possible that once the optical printing tool and X-ray mask processing distortions are characterized in the first two steps of the above procedure corrections can be implemented in the E-beam writer, and subsequent X-ray masks may be fabricated using only the latter steps. In addition to X-ray lithography masks, the technique may be advantageous in the fabrication of optical reticle devices, or any other type of pattern delineation.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A method of fabrication of a 1X X-ray mask, comprising the steps of:

fabricating a 1X X-ray "daughter" mask from a master pattern with an NX reduction optical tool to capture larger features;

writing a plurality of coarse features with an optical tool; and capturing a plurality of critical features with a higher resolution tool.

2. The method as in claim 1 wherein said higher resolution tool used in said step of capturing is an E-beam direct write tool.

3. The method as in claim 2 wherein said step of capturing includes fine patterning said plurality of coarse features written with said optical tool to square-off a plurality of corners of each of said coarse features with said E-beam direct write tool.

4. A method of fabrication of a 1X X-ray mask, comprising the steps of:

fabricating an NX optical reticle with a plurality of coarse features;

fabricating a 1X X-ray daughter mask from said reticle with an NX power reduction optical tool;

measuring a plurality of mask distortions caused by lithography and X-ray processing;

fabricating a second optical reticle corrected for plurality of said measured distortions;

fabricating a second daughter mask having a plurality of coarse features from said second optical reticle;

characterizing a plurality of distortions on said second daughter mask;

determining an alignment strategy;

coating said second daughter mask with a resist;

electron beam writing a plurality of critical features aligned to coarse features;

processing said plurality of critical features on said second daughter mask; and inspecting and repairing said second daughter mask.

5. The method of claim 4 further comprising the steps of:

measuring a position of one of said coarse features using an E-beam mask writer and producing alignment information, prior to step of electron beam writing; and completing said step of electron beam writing using said alignment information produced.

6. A method of fabricating multiple 1X X-ray masks, comprising the steps of:

fabricating an NX optical reticle with a plurality of coarse features;

fabricating a 1X X-ray daughter mask from said reticle with an NX power reduction optical tool;

measuring a plurality of mask distortions caused by lithography and X-ray processing;

fabricating a second optical reticle corrected for measured distortions;

fabricating a plurality of second daughter masks having a plurality of coarse features from said second optical reticle;

characterizing a plurality of distortions on one of said second daughter masks;

determining an alignment strategy;

coating each of said second daughter masks with resist;

electron beam writing a plurality of critical features aligned to said coarse features;

processing each of said second daughter masks; and inspecting and repairing each of said second daughter masks.

7. A method as recited in claim 6 wherein distortions on said second daughter masks are characterized using electron detection for the purpose of registering a back scanner electron from said characterized second daughter mask and a transmitted electron which passes through the membrane of said characterized second daughter mask comprising the steps of:

electron beam scanning a patterned mask; and registering a signal from said electron beam scanning.

8. A method of fabrication of a 1X X-ray mask, comprising the steps of:

fabricating an NX optical reticle with a plurality of coarse features;

fabricating a 1X X-ray daughter mask from said reticle with an NX power reduction optical tool;

measuring a plurality of mask distortions caused by lithography and X-ray processing;

fabricating a second optical reticle corrected for measured distortions;

partially fabricating a second daughter mask from said second optical reticle;

characterizing a plurality of distortions on said second daughter mask;

determining an alignment strategy;

coating said second daughter mask with a resist;

electron beam writing a plurality of coarse features and a plurality of critical features;

processing said second daughter mask; and inspecting and repairing said second daughter mask.

9. A method as in claim 8 wherein said step of partially fabricating said second daughter mask comprises electroplate depositing an absorber pattern to a thickness of less than 100 nm.

10. A method as in claim 8 wherein said step of partially fabricating said second daughter mask comprises etching an absorber pattern to a thickness of less than 100 nm.

* * * * *